US012783161B2

(12) United States Patent
Lee et al.

(10) Patent No.: US 12,783,161 B2
(45) Date of Patent: Nov. 3, 2026

(54) METHOD FOR WRITING TEST PARAMETERS TO BOARD MEMORIES

(71) Applicants: Ping-Huang Lee, Taoyuan City (TW); Hou-Chun Chen, Taoyuan City (TW); Ching-Hua Chu, Taoyuan City (TW)

(72) Inventors: Ping-Huang Lee, Taoyuan City (TW); Hou-Chun Chen, Taoyuan City (TW); Ching-Hua Chu, Taoyuan City (TW)

(73) Assignee: Chroma ATE Inc., Taoyuan City (TW)

( * ) Notice: Subject to any disclaimer, the term of this patent is extended or adjusted under 35 U.S.C. 154(b) by 7 days.

(21) Appl. No.: 19/000,790

(22) Filed: Dec. 24, 2024

(65) Prior Publication Data

US 2025/0217068 A1 Jul. 3, 2025

(30) Foreign Application Priority Data

Dec. 28, 2023 (TW) ................................ 112151180

(51) Int. Cl.
*G06F 12/00* (2006.01)
*G06F 3/06* (2006.01)
*G11C 29/48* (2006.01)

(52) U.S. Cl.
CPC .......... *G06F 3/0655* (2013.01); *G06F 3/0604* (2013.01); *G06F 3/0673* (2013.01); *G11C 29/48* (2013.01)

(58) Field of Classification Search
None
See application file for complete search history.

(56) References Cited

U.S. PATENT DOCUMENTS

2007/0283197 A1* 12/2007 Jordan .................. G11C 29/56 714/724
2007/0300118 A1* 12/2007 Reak ................ G01R 31/31908 714/742
2021/0216479 A1* 7/2021 Stave .................. G11C 11/4072
2022/0157396 A1* 5/2022 Geiger ................. G01R 31/317
2022/0317185 A1* 10/2022 Ru ................... G01R 31/31722

* cited by examiner

*Primary Examiner* — Daniel D Tsui

(57) ABSTRACT

The present invention provides a method for writing test parameters into board memory, comprising: establishing a channel-pin mapping table associated with each test board, the channel-pin mapping table indicating that an i-th channel among M channels corresponds to a j-th pin among N pins of the respective test board; converting each test code transmitted by the M channels at a first time into a corresponding set of test parameters; maintaining a channel-code mapping table in a test register, the channel-code mapping table storing the set of test parameters corresponding to the i-th channel among the M channels at the first time; and writing the set of test parameters corresponding to the i-th channel at the first time into a physical address of the board memory of each corresponding test board based on the channel-pin mapping table and the stored channel-code mapping table.

4 Claims, 5 Drawing Sheets

| channel-pin mapping table of test board No. 0 | | | | | | | |
|---|---|---|---|---|---|---|---|
| pin | 63 | 62 | 61 | ... | 2 | 1 | 0 |
| channel | | | | | 3 | 2 | 1 |

| channel-pin mapping table of test board No. 3 | | | | | | | |
|---|---|---|---|---|---|---|---|
| pin | 63 | 62 | 61 | ... | 2 | 1 | 0 |
| channel | 1 | 2 | 3 | | | | |

FIG. 3

| test register | | | | |
|---|---|---|---|---|
| channel | 1 | 2 | 3 | ... |
| test parameters | 110 | 010 | 110 | |

FIG. 4

| board memory of test board No. 0 | | | | | | | |
|---|---|---|---|---|---|---|---|
| physical address | 63 | 62 | 61 | ... | 2 | 1 | 0 |
| test task 1 | | | | | 110 | 010 | 110 |
| test task 2 | | | | | 010 | 100 | 110 |

| board memory of test board No. 3 | | | | | | | |
|---|---|---|---|---|---|---|---|
| physical address | 63 | 62 | 61 | ... | 2 | 1 | 0 |
| test task 1 | 110 | 010 | 110 | | | | |
| test task 2 | 010 | 100 | 110 | | | | |

FIG. 5

METHOD FOR WRITING TEST PARAMETERS TO BOARD MEMORIES

CROSS REFERENCE TO RELATED APPLICATION

The present application claims priority to Taiwan patent application Serial No. 112151180 filed on Dec. 28, 2023 the entire content of which is incorporated by reference to this application.

BACKGROUND OF THE INVENTION

1. Field of the Invention

The present invention relates to a method for writing test parameters into board memories, particularly to a method capable of improving the efficiency of writing test parameters.

2. Description of the Prior Art

To enhance testing efficiency, a typical test device needs to simultaneously test multiple chips under test. The test device is equipped with a plurality of test boards, each of which can define a plurality of test sites. Chips under test are placed into these test sites for testing. In practice, a single test site may correspond to a plurality of pins of a test board, with each corresponding pin electrically connected to a corresponding pad of the chip under test. Through this connection, the test board can read data from or write data to the chip under test at the test site. However, when the test device writes test parameters into the board memories of these test boards, it often requires a considerable amount of time.

Please refer to FIG. 1, which is a flowchart illustrating the steps of a conventional method for writing test parameters into board memories. As shown in FIG. 1, in step S90, the conventional test device first looks up the physical address of the board memories. Here, it is assumed that the test device determines that the first channel corresponds to pin No. 63 of test board No. 3 and pin No. 0 of test board No. 0, the second channel corresponds to pin No. 62 of test board No. 3 and pin No. 1 of test board No. 0, and the third channel corresponds to pin No. 61 of test board No. 3 and pin No. 2 of test board No. 0.

Next, in step S92, the conventional test device converts the test code of each channel into a corresponding set of test parameters. For example, a channel may transmit test codes such as 0, 1, 2, etc., where test codes 0, 1, and 2 each represent a specific test pattern. Then, in step S94, the conventional test device combines the physical addresses of the board memories with the corresponding test parameters in a plurality of registers. Here, the conventional test device needs to allocate one register for each test board, allowing the register to first combine the physical address of the corresponding board memories with the test parameters. For instance, address 0 of the register for test board No. 0 needs to store "the test parameters corresponding to physical address 0 of the board memory," address 1 needs to store "the test parameters corresponding to physical address 1 of the board memory," and so forth.

Finally, in step S96, the conventional test device writes the data from the register of each test board into the corresponding board memory. For example, the conventional test device writes the data from the register of test board No. 0 into the first row of the board memory of test board No. 0, representing the test task to be executed by test board No. 0 at a first time (time interval). In other words, the test parameters stored at address 0 of the register are written into physical address 0 of the board memory, and the test parameters stored at address 1 of the register are written into physical address 1 of the board memory. Those skilled in the art will understand that the test device needs to continuously execute a plurality of test tasks for the chips under test. This means that the conventional test device often has to repeat steps S92 to S96 several times to complete writing a series of test tasks. In particular, repeatedly combining the physical addresses of the board memories with the corresponding test parameters in the registers (S94) is time-consuming, and allocating a register for each test board also incurs higher costs. Accordingly, there is a need in the industry for a new method for writing test parameters into board memories to reduce hardware costs and improve the testing efficiency of the test device.

SUMMARY OF THE INVENTION

The present invention provides a method for writing test parameters into board memories, which eliminates the need to combine the physical address of the board memory with the corresponding test parameters in the register, thereby reducing the number of registers required and improving the testing efficiency of the test device.

The present invention provides a method for writing test parameters into board memories, used in a test device having a plurality of test boards, each of the test boards having N pins. The method comprises: establishing a channel-pin mapping table associated with each of the test boards, the channel-pin mapping table indicating that an i-th channel among M channels corresponds to a j-th pin among the N pins of the respective test board; converting each test code transmitted by the M channels at a first time into a corresponding set of test parameters; maintaining a channel-code mapping table in a test register, the channel-code mapping table storing the set of test parameters corresponding to the i-th channel among the M channels at the first time; and writing the set of test parameters corresponding to the i-th channel at the first time into a physical address of the board memory of each corresponding test board based on the channel-pin mapping table and the channel-code mapping table. Wherein the physical address of the board memory is associated with the j-th pin among the N pins, M and N are positive integers, i is a positive integer not greater than M, and j is a positive integer not greater than N.

In some embodiments, the method for writing test parameters into board memories further comprises: converting each test code transmitted by the M channels at a second time into another corresponding set of test parameters to update the channel-code mapping table maintained in the test register, the channel-code mapping table indicating the set of test parameters corresponding to the i-th channel among the M channels at the second time; and writing the set of test parameters corresponding to the i-th channel at the second time into the board memory of each corresponding test board based on the channel-pin mapping table and the updated channel-code mapping table. Here, the set of test parameters stored in the board memory of each test board corresponding to the first time is a first test task, and the set of test parameters stored corresponding to the second time is a second test task subsequent to the first test task. Additionally, each of the test boards is provided with at least one test position, the test position being configured to accommodate a chip under test, and the test position defining a plurality of connection pads, each of the connection pads corresponding to one of the N pins.

In summary, the method for writing test parameters into board memories provided by the present invention utilizes the establishment of a channel-pin mapping table and a channel-code mapping table to significantly reduce the time required to combine the physical address of the board memory with the corresponding test parameters. Furthermore, the present invention requires only one test register, unlike the conventional approach that necessitates allocating a corresponding register for each test board, thereby not only reducing costs but also improving the testing efficiency of the test device.

BRIEF DESCRIPTION OF THE APPTERMINALED DRAWINGS

FIG. 3 is a schematic diagram illustrating a channel-pin mapping table according to an embodiment of the present invention.

FIG. 4 is a schematic diagram illustrating a channel-code mapping table according to an embodiment of the present invention.

FIG. 5 is a schematic diagram illustrating the writing of test parameters into a board memory according to an embodiment of the present invention.

DETAILED DESCRIPTION OF THE INVENTION

The features, targetions, and functions of the present invention are further disclosed below. However, it is only a few of the possible embodiments of the present invention, and the scope of the present invention is not limited thereto; that is, the equivalent changes and modifications done in accordance with the claims of the present invention will remain the subject of the present invention. Without departing from the spirit and scope of the invention, it should be considered as further enablement of the invention.

Figure 1:
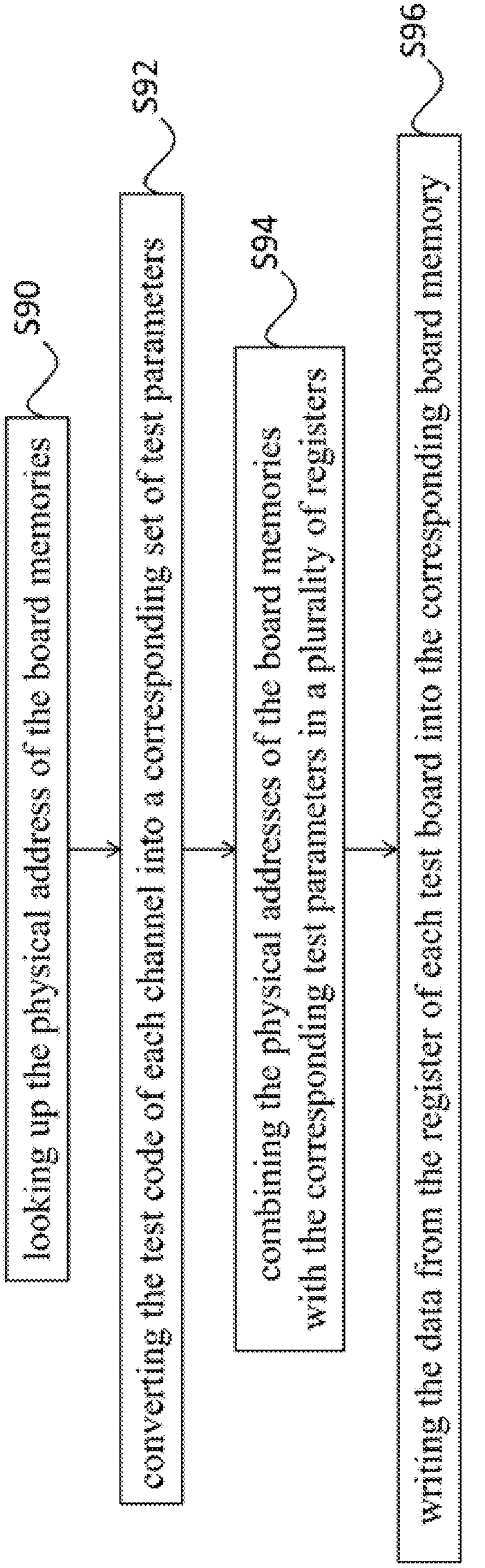
FIG. 1 (Prior Art)
FIG. 1 is a flowchart illustrating the steps of a conventional method for writing test parameters into board memories.
Figure 2:
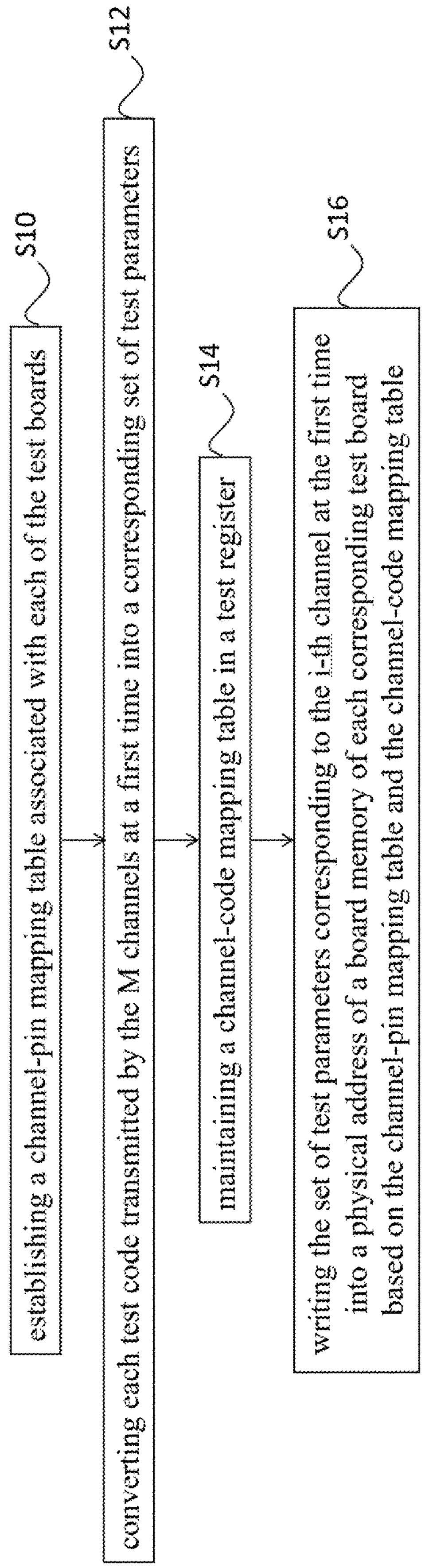
FIG. 2 is a flowchart illustrating the steps of a method for writing test parameters into board memories according to an embodiment of the present invention.

Please refer to FIG. 2 and FIG. 3 together. FIG. 2 is a flowchart illustrating the steps of a method for writing test parameters into board memories according to an embodiment of the present invention, and FIG. 3 is a schematic diagram illustrating a channel-pin mapping table and a channel-code mapping table according to an embodiment of the present invention. As shown, the present invention is applied to a test device, which may include a plurality of test boards, each of the test boards having multiple pins (N pins). In practice, each test board is provided with at least one test position, the test position being configured to accommodate a chip under test, and the test position defining a plurality of connection pads for electrically connecting to the chip under test. Each connection pad may correspond to one of the pins. In other words, the test device can transmit signals to the chip under test or retrieve signals from the chip under test via the pins of the test board. Here, this embodiment describes a scenario where, when the test device needs to transmit test signals to the chip under test, it is often necessary to first write the relevant signals into the board memory of the corresponding test board.

Unlike the conventional method for writing test parameters into board memories, this embodiment does not require repeatedly combining the physical address of the board memory with the corresponding test parameters in registers multiple times. For a practical example, assume the test device determines that the first channel corresponds to pin No. 63 of test board No. 3 and pin No. 0 of test board No. 0, the second channel corresponds to pin No. 62 of test board No. 3 and pin No. 1 of test board No. 0, and the third channel corresponds to pin No. 61 of test board No. 3 and pin No. 2 of test board No. 0.

In step S10, the test device of this embodiment can pre-establish a channel-pin mapping table associated with each test board. For example, as illustrated in FIG. 3, this embodiment may establish a channel-pin mapping table for test board No. 0, where this channel-pin mapping table indicates the channel name corresponding to each pin on test board No. 0. Here, FIG. 3 shows that the test device provides 3 channels (M channels), with pin No. 0 corresponding to the channel named 1, pin No. 1 corresponding to the channel named 2, and pin No. 2 corresponding to the channel named 3. Additionally, a channel-pin mapping table is also established for test board No. 3, indicating that pin No. 63 corresponds to the channel named 1, pin No. 62 corresponds to the channel named 2, and pin No. 61 corresponds to the channel named 3. Those skilled in the art will understand that channel names can be freely defined, and this embodiment imposes no restrictions in this regard. Furthermore, as described above, a single channel (e.g., channel 1) can simultaneously correspond to different test positions on different test boards, i.e., different pins. This embodiment does not limit the number of test positions or pins that a single channel can correspond to. It is worth noting that not all pins on a test board are necessarily utilized; if certain pins of a test board do not correspond to any channel, the numbers of those pins will not be associated with any channel name in the table.

Next, in step S12, the test device of this embodiment can convert each test code transmitted by all channels at a first time into a corresponding set of test parameters. For example, at the first time, each channel may respectively transmit its own test code, such as 0, 1, 2, L, H, X, Z, V, etc., each representing a specific test pattern. In one example, test code 0 may correspond to command signals comprising parameters TP, IO, and CARE, allowing the test device to combine these parameters (TP, IO, and CARE) to form the test pattern indicated by the channel. Those skilled in the art should understand the meanings of parameters TP, IO, and CARE, and this embodiment will not elaborate further on them.

Next, in step S14, the test device of this embodiment can provide a test register, and the test register can maintain a channel-code mapping table. Here, the channel-code mapping table can store the set of test parameters corresponding to the i-th channel among M channels at the first time. Please refer to FIG. 4, which is a schematic diagram illustrating a channel-code mapping table according to an embodiment of the present invention. As shown in FIG. 4, the channel-code mapping table lists all channel names, with each channel name corresponding to a set of test parameters. In practice, the first time refers to the duration of the test parameters (or the corresponding test patterns) provided by the M channels. Assuming the first time (duration) is designated as TM0, all test parameters listed in the channel-code mapping table in FIG. 4 correspond to the first time (TM0).

Next, in step S16, the test device of this embodiment writes the set of test parameters stored in the test register (corresponding to the first time) into the physical address of the board memory of the corresponding test board based on the channel-pin mapping table and the channel-code mapping table stored in the test register. Using the example above, please refer to FIG. 3 to FIG. 5 together. FIG. 5 is a schematic diagram illustrating the writing of test parameters into a board memory according to an embodiment of the present invention. As shown, the test device of this embodiment can determine, based on the channel-pin mapping table of test board No. 0, that pin No. 0 corresponds to the channel named 1, allowing the test device to retrieve the test parameters corresponding to the channel named 1 and write them into the physical address No. 0 of the board memory of test board No. 0. Those skilled in the art will understand that the test parameters stored at physical address No. 0 of the board memory represent the test behavior for pin No. 0.

The test device of this embodiment can then determine, based on the channel-pin mapping table of test board No. 0, that pins No. 1, 2, . . . correspond to channels named 2, 3, . . . , allowing the test device to retrieve the test parameters corresponding to the channels named 2, 3, . . . and write them into the physical addresses No. 1, 2, . . . of the board memory of test board No. 0. Similarly, the test device of this embodiment can further determine, based on the channel-pin mapping table of test board No. 3, that pins No. 63, 62, 61, . . . correspond to channels named 1, 2, 3, . . . , allowing the test device to retrieve the test parameters corresponding to the channels named 1, 2, 3, . . . and write them into the physical addresses No. 63, 62, 61, . . . of the board memory of test board No. 3.

After the test device of this embodiment writes the test parameters of all channels corresponding to the first time into the board memory of each test board, it can then proceed to process test tasks associated with a second time. In practice, the channel-pin mapping table associated with each test board, which indicates the hardware connection relationships, should remain unchanged between consecutive test tasks. Therefore, the test device of this embodiment can reuse the already established channel-pin mapping table associated with each test board without needing to re-establish it.

Assuming the test task at the second time is similar to the test task at the first time, the test device of this embodiment returns to step S12 in FIG. 2, performing a similar process as before by converting each test code transmitted by all channels at the second time into another corresponding set of test parameters. Next, in the subsequent step, the test register can be updated to store the set of test parameters corresponding to the i-th channel among the M channels at the second time. Since the test register has been updated with the new test parameters, in the following step, the test device of this embodiment writes the set of test parameters stored in the test register (corresponding to the second time) into the physical address of the board memory of the corresponding test board based on the channel-pin mapping table and the updated channel-code mapping table stored in the test register. By repeating this process, the board memory of each test board can be updated with all the test parameters required for each pin across every test task.

In summary, the method for writing test parameters into board memories provided by the present invention utilizes the establishment of a channel-pin mapping table and a channel-code mapping table to significantly reduce the time required to combine the physical address of the board memory with the corresponding test parameters. Furthermore, the present invention requires only one test register, unlike the conventional approach that necessitates allocating a corresponding register for each test board, thereby not only reducing costs but also improving the testing efficiency of the test device.

What is claimed is:

1. A method for writing test parameters into board memories, used in a test device having a plurality of test boards, each of the test boards having N pins, the method comprising:

establishing a channel-pin mapping table associated with each of the test boards, the channel-pin mapping table indicating that an i-th channel among M channels corresponds to a j-th pin among the N pins of the respective test board;

converting each test code transmitted by the M channels at a first time into a corresponding set of test parameters;

maintaining a channel-code mapping table in a test register, the channel-code mapping table storing the set of test parameters corresponding to the i-th channel among the M channels at the first time; and writing the set of test parameters corresponding to the i-th channel at the first time into a physical address of a board memory of each corresponding test board based on the channel-pin mapping table and the channel-code mapping table;

wherein the physical address of the board memory is associated with the j-th pin among the N pins;

wherein M and N are positive integers, i is a positive integer not greater than M, and j is a positive integer not greater than N.

2. The method for writing test parameters into board memories according to claim 1, the method further comprising:

converting each test code transmitted by the M channels at a second time into another corresponding set of test parameters;

updating the channel-code mapping table maintained in the test register, the channel-code mapping table indicating the set of test parameters corresponding to the i-th channel among the M channels at the second time; and writing the set of test parameters corresponding to the i-th channel at the second time into the board memory of each corresponding test board based on the channel-pin mapping table and the updated channel-code mapping table.

3. The method for writing test parameters into board memories according to claim 2, wherein the set of test parameters stored in the board memory of each test board corresponding to the first time is a first test task, and the set of test parameters stored corresponding to the second time is a second test task subsequent to the first test task.

4. The method for writing test parameters into board memories according to claim 1, wherein each of the test boards is provided with at least one test site, the test site being configured to accommodate a chip under test, and the test site defining a plurality of connection pads, each of the connection pads corresponding to one of the N pins.

* * * * *